(12) United States Patent
Chang

(10) Patent No.: US 6,562,546 B2
(45) Date of Patent: May 13, 2003

(54) METHOD FOR FORMING CROSS-LINKING PHOTORESIST AND STRUCTURES FORMED THEREBY

(75) Inventor: Wen-Pin Chang, Hsinchu (TW)

(73) Assignee: Winbond Electronics Corp., Hsinchu (TW)

(*) Notice: Subject to any disclaimer, the term of this patent is extended or adjusted under 35 U.S.C. 154(b) by 0 days.

(21) Appl. No.: 10/053,132

(22) Filed: Jan. 17, 2002

(65) Prior Publication Data

US 2002/0064730 A1 May 30, 2002

Related U.S. Application Data

(62) Division of application No. 09/443,664, filed on Nov. 4, 1999, now Pat. No. 6,365,263.

(30) Foreign Application Priority Data

May 27, 1999 (TW) .................................. 88108787 A

(51) Int. Cl.[7] .................................................. G03F 7/00
(52) U.S. Cl. ....................................... 430/313; 430/330
(58) Field of Search ................................. 430/311, 313, 430/328, 330

(56) References Cited

U.S. PATENT DOCUMENTS 5,648,198 A * 7/1997 Shibata ...................... 430/296

* cited by examiner

Primary Examiner—Kathleen Duda
(74) Attorney, Agent, or Firm—Gottlieb, Rackman & Reisman, P.C.

(57) ABSTRACT

A method for forming a cross-linking photoresist layer is provided. The method includes steps of providing a photoresist layer; activating the photoresist layer with a light provided by a light source; and putting the photoresist layer in a vapor of a cross-linking agent to form the cross-linking photoresist layer.

19 Claims, 2 Drawing Sheets

METHOD FOR FORMING CROSS-LINKING PHOTORESIST AND STRUCTURES FORMED THEREBY

This application is a division of U.S. Ser. No. 09/433,664 filed Nov. 4, 1999 now U.S. Pat. No. 6,365,263, which claims priority to the Taiwan patent application No. 88108787 filed May 27, 1999. The contents of this application is incorporated herein by reference.

FIELD OF THE INVENTION

The present invention relates to a method for forming a photoresist, and more particularly relates to a method for forming a cross-linking chemically amplified resist in a semiconductor manufacturing process.

BACKGROUND OF THE INVENTION

As the integration of the semiconductor device is increasing, the scale of the semiconductor device is getting smaller. To successfully manufacturing a semiconductor device, a photolithography process is more important than ever. An example of a photolithography process is shown in FIG. 1. A deep ultra violet (DUV) ray 4 having a wavelength of 248 nano-meter (nm) is illuminated from a light source (not shown) to a mask 3. The pattern formed on the mask 3 will be transferred to the positive photoresist layer 2 coated on the surface of the substrate 1 through the illumination of the DUV ray 4. After a post exposure bake step, the pattern transferred to the photoresist layer 2 is formed by a development procedure.

As the line width of the pattern on the mask become smaller, a more exact photolithography process is needed. Methods for increasing the resolution of the transferred pattern are developed. Some of them are the utilization of phase shifting mask, the technique of the off-axis illumination, the utilization of an anti-reflection layer, and the utilization of a thinner resist layer, etc.

Among the above-mentioned method, using a thinner resist layer is not even convenient but also effective. The thinner the photoresist is, the higher the resolution of the transferred pattern is obtained. That is because a thinner photoresist can bear a higher vibration and/or miss-alignment than a thick photoresist. Accordingly, the thinner photoresist layer will have a uniform focus from the top surface to the bottom portion.

However, a photoresist layer cannot be too thin. When the thickness of a photoresist layer is reduced to a certain value, the etch-resistance of the photoresist layer will be influenced. Accordingly, the structure on the substrate will be damaged during the succeeding etching or ion-implanting process. In other words, the reduction of the photoresist layer thickness is limited at the etch-resistance of the photoresist layer.

To make the photoresist layer further thinner, the etch-resistance and/or the ion-implant-resistance of the photoresist must be enhanced. Usually, a hard bake process is used to increase the etch-resistance by reducing the amount of the solvent remained in the photoresist layer and increasing the adhesion between the photoresist layer and the substrate. However, the hard bake process only provides a very little improvement to the etch-resistance of the photoresist layer. The hard bake process does not cause any chemical reaction. The intrinsic property of the photoresist layer cannot be changed by the hard bake process.

It is then attempted by the Applicant to solve the above-mentioned problems.

SUMMARY OF THE INVENTION

An object of the present invention is to provide a relatively thin photoresist layer which has a good etch-resistance and ion-implant-resistance.

According to the present invention, a method for forming a cross-linking photoresist layer is provided. The method includes steps of providing a photoresist layer; activating the photoresist layer with a light provided by a light source; and putting the photoresist layer in a vapor of a cross-linking agent to form the cross-linking photoresist layer.

The photoresist layer is preferably a patterned photoresist layer. More preferably, the photoresist layer is a chemically amplified resist layer.

The activating light is preferably an ultra violet (UV) ray having a wave length of about 365 nm.

Of course, the method may further include a step of baking the photoresist layer after the photoresist layer is activated by the light.

The cross-linking agent is preferably butadiene diepoxy (BTDE).

The cross-linking photoresist layer is preferably formed at a temperature ranged between about 80° C. to about 120° C. Preferably, the temperature is about 100° C. The temperature is obtained by heating the photoresist layer by a hot plate. The photoresist layer is preferably heated for about 10 seconds to 30 minutes.

Preferably, the photoresist layer is provided on a substrate.

The present invention further provides a semiconductor structure. The semiconductor includes a substrate; a patterned photoresist layer formed on the substrate; and a cross-linking structure covering the surface of the patterned photoresist layer.

Preferably, the patterned photoresist layer is a chemically amplified resist layer. The patterned photoresist layer preferably has a structure of:

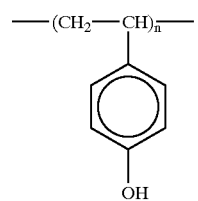

Preferably, the cross-linking stricture has a structure of:

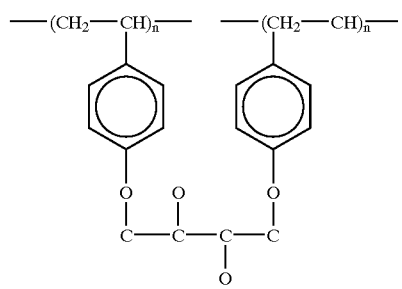

According to another aspect of the present invention, a method for manufacturing a semiconductor device is provided. The method includes steps of forming a photoresist layer on a substrate; patterning the photoresist layer; forming a cross-linking layer over the surface of the photoresist layer; and etching the semiconductor structure with a mask composed of the photoresist layer and the, cross-linking layer.

The photoresist layer is preferably a chemically amplified resist layer.

The photoresist layer preferably has a structure of:

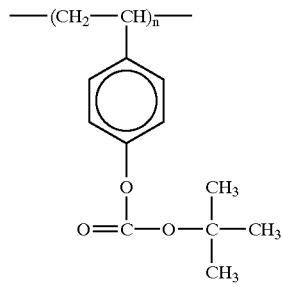

Steps for forming the cross-linking layer preferably include activating the photoresist layer to generate thereon a hydroxy group; and putting the photoresist layer into an atmosphere of a cross-linking agent to generate the cross-linking layer.

Preferably, the photoresist layer is heated by a hot plate at a temperature of about 100° C. when being put into the atmosphere of the cross-linking agent. The cross-linking agent is preferably butadiene diepoxy, and the photoresist layer is preferably heated by the hot plate for about 10 seconds to 30 minutes.

The photoresist layer is preferably activated by ultra violet ray having a wavelength of about 365 nm.

The method may further includes a step of implanting the semiconductor structure with the mask.

The present invention may best be understood through the following description with reference to the accompanying drawings, in which:

DETAILED DESCRIPTION OF THE PREFERRED EMBODIMENTS

A conventional thin photoresist layer cannot provide a good etch-resistance for the succeeding etching and implanting processes. Accordingly, the present invention provides a cross-linking structure for the photoresist layer to improve the etch-resistance. A method for forming the cross-linking structure on the surface of the photoresist layer is also provided. The cross-linking structure provides a good protect for the photoresist layer during the succeeding etching and implanting processes.

Figure 1A:
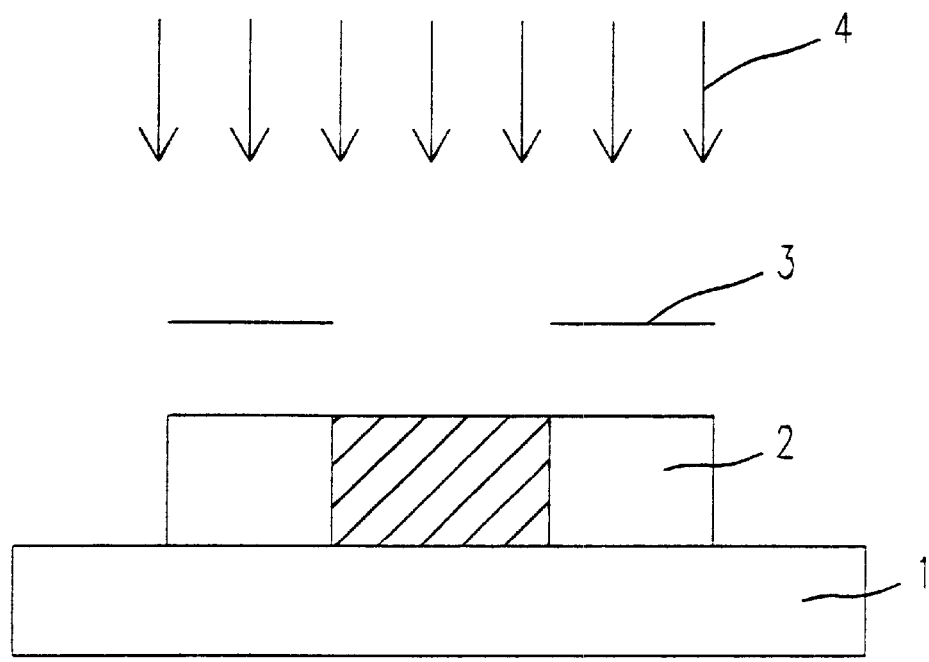
FIGS. 1(a) AND 1(b) illustrate steps for forming a conventional photoresist layer.
Figure 1B:
Figure 2A:
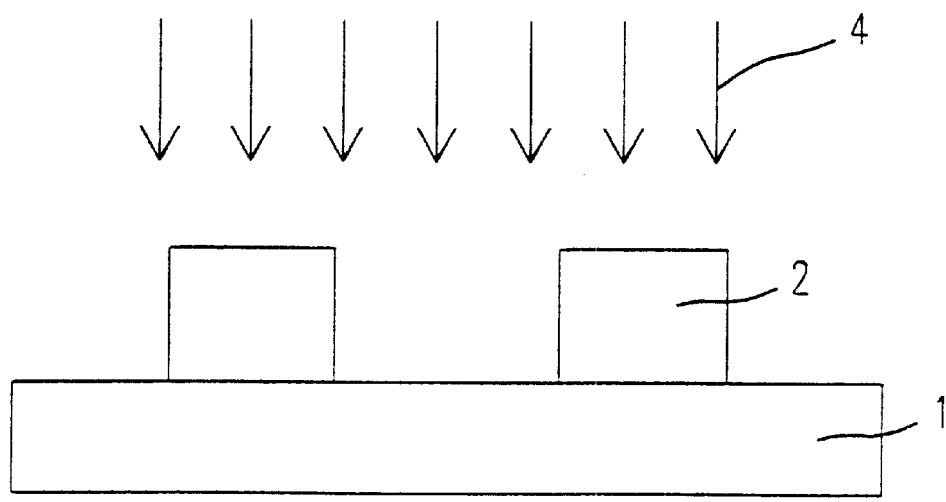
FIGS. 2(a) and 2(b) illustrates steps for forming a cross-linking photoresist layer according to the present invention.

FIG. 2 illustrates a method for forming the cross-linking photoresist layer. A patterned photoresist layer 2 is provided on a substrate 1. Processes for patterning the photoresist layer 2 are the same as the above-mentioned conventional processes. The photoresist layer 2 is a chemically amplified resist. The photoresist layer 2 is illuminated by an ultra violet ray 5 and thus is activated. The wavelength of the ultra violet ray 5 does not have to be as short as that of the light for patterning the photoresist layer 2. The deep ultra violet ray used for patterning generally has a wavelength of 248 nm. However, a general wavelength, such as 365 nm, is good enough for the ultra violet ray 5.

Figure 2B:
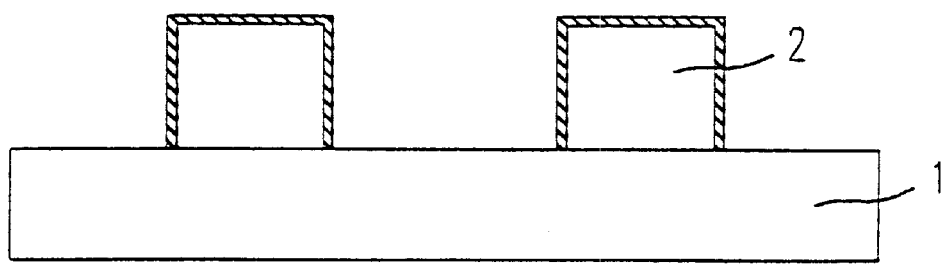

Then, the photoresist layer 2 is placed into an atmosphere of vaporized cross-linking agent. Of course, before being placed into the vapor of the cross-linking agent, a hard bake process can be executed to the activated photoresist layer 2. The cross-linking agent may be butadiene diepoxy (BTDE). Under the cross-linking agent atmosphere, the photoresist layer 2 is heated by a hot plate at a temperature between 80° C. to 120° C. A preferred heating temperature is 100° C. The heating process is lasting for about 10 seconds to 30 minutes and then the cross-linking stricture is formed on the surface of the photoresist layer 2, as shown in FIG. 2(b).

For example, a generally-used chemically amplified resist is exposed to the ultra violet ray. The reaction is as follows:

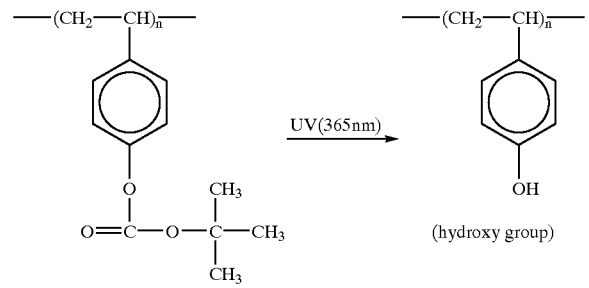

After the exposure and baking processes, the hydroxy group (—OH—) will be generated on the chemically amplified resist.

The photoresist layer is then heated by a hot plate at a temperature of 100° C. under an atmosphere of BTDE vapor. After about 10 seconds to 30 minutes, a three-dimensional cross-linking structure is formed on the surface of the chemically amplified resist layer.

The cross-linking reaction is as follows:

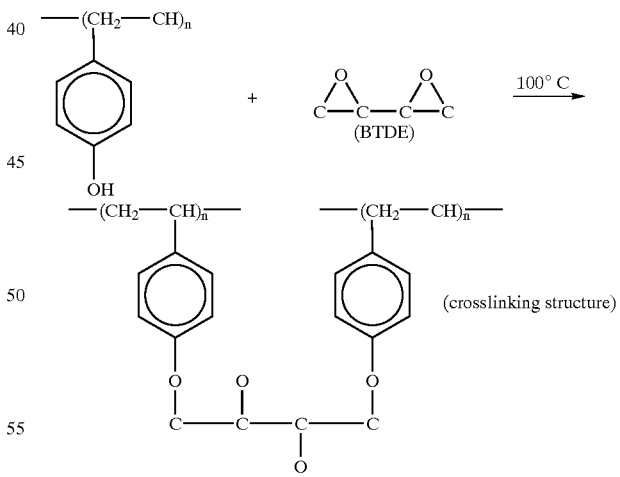

Such a harden chemically amplified resist layer has a better resistance to the succeeding etching and implanting processes. According to the method of forming the cross-linking resist layer, the thickness of the photoresist layer can be reduced so that the accuracy and the resolution of the pattern transferring during the photolithography process.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming a cross-linking photoresist layer, comprising steps of:

providing a photoresist layer;

activating said photoresist layer with a light provided by a light source; and putting said photoresist layer in a vapor of a cross-linking agent being butadiene diepoxy to form said cross-linking photoresist layer.

2. A method according to claim 1 wherein said photoresist layer is a patterned photoresist layer.

3. A method according to claim 1 wherein said photoresist layer is a chemically amplified resist layer.

4. A method according to claim 1, wherein said light is an ultra violet (UV) ray.

5. A method according to claim 4 wherein said ultra violet ray has a wavelength of about 365 nm.

6. A method according to claim 1, further comprising a step of:

baking said photoresist layer after said photoresist layer is activated by said light.

7. A method according to claim 6 wherein said cross-linking photoresist layer is formed at a temperature ranged between about 90 to about 120.

8. A method according to claim 7 wherein said temperature is about 100° C.

9. A method according to claim 7 wherein said temperature is obtained through heating said photoresist layer by a hot plate.

10. A method according to claim 9 wherein said photoresist layer is heated for about 10 seconds to 30 minutes.

11. A method according to claim 1 wherein said photoresist layer is provided on a substrate.

12. A method for manufacturing a semiconductor device, comprising steps of:

forming a photoresist layer on a substrate;

patterning said photoresist layer;

forming a cross-linking layer with a cross-linking agent being butadiene diepoxy over the surface of said photoresist layer; and etching said semiconductor structure having said photoresist layer and said cross-linking layer.

13. A method according to claim 12 wherein said photoresist layer is a chemically amplified resist layer.

14. A method according to claim 13 wherein said photoresist layer has a structure of:

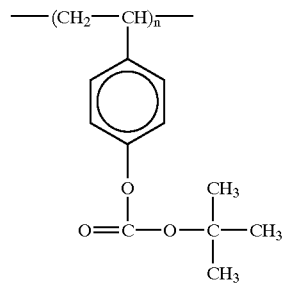

wherein "n" is a natural number.

15. A method according to claim 14 wherein steps for forming said cross-linking layer include:

activating said photoresist layer to generate thereon a hydroxy group; and putting said photoresist layer into an atmosphere of a cross-linking agent to generate said cross-linking layer.

16. A method according to claim 15 wherein said photoresist layer is heated by a hot plate at a temperature of about 100° C. when being put into said atmosphere of said cross-linking agent.

17. A method according to claim 16 wherein said photoresist layer is heated by said hot plate for about 10 seconds to 30 minutes.

18. A method according to claim 15 wherein said photoresist layer is activated by a ultra violet ray having a length of about 365 nm.

19. A method according to claim 12, further comprising a step of:

implanting said semiconductor structure.

* * * * *